United States Patent [19]
Garvey

[11] Patent Number: 4,966,887
[45] Date of Patent: Oct. 30, 1990

[54] METHOD FOR THE PRODUCTION OF OXIDE SUPERCONDUCTING FILMS BY LASER ASSISTED MOLECULAR BEAM EPITAXY

[75] Inventor: James F. Garvey, Amherst, N.Y.

[73] Assignee: The Research Foundation of State University of NY, Albany, N.Y.

[21] Appl. No.: 211,477

[22] Filed: Jun. 24, 1988

[51] Int. Cl.⁵ .................. H01L 39/24; B22F 9/04
[52] U.S. Cl. ........................... 505/1; 156/610;
427/53.1; 427/57; 437/18; 505/730; 428/930
[58] Field of Search .............. 156/610; 427/53.1, 57;
437/18; 505/1, 730; 428/930

[56] References Cited

U.S. PATENT DOCUMENTS 4,483,725 11/1984 Chang ............................ 148/175
4,624,859 11/1986 Akira et al. ..................... 437/18
4,652,463 3/1987 Peters ........................... 427/53.1
4,828,874 5/1989 Hiraoka et al. ............... 427/53.1

FOREIGN PATENT DOCUMENTS 0265886 5/1988 European Pat. Off. ........... 505/1

OTHER PUBLICATIONS

Weimer et al. in Hig $T_c$ Superconductors II, ed. Capone, II et al., MRS, Apr. '88, p. 137.
Lynds et al, in MRS Proc. vol. 99 ed. Brodsky et al., Pittsburg, 1987, p. 707.
Washburn et al., IBID, p. 699.
Yurek et al. Met. Trans. A. 18A (1987) 1813.
Webb et al. Appl. Phys. Letts, 51 (1987) 1192.

Primary Examiner—Upendra Roy
Attorney, Agent, or Firm—Ellen K. Park; Michael L. Dunn

[57] ABSTRACT

The present invention relates to a method of directly forming a thin, oriented layer, or film, of superconducting materials, or compositions suitably mixtures of Perovskite-type superconducting oxides, on a support base, or substrate, by the use of a laser assisted molecular beam epitaxy. The method steps generally comprise forming at least one target comprised of metallic precursors of a superconducting oxide composition and vaporizing at least a portion of the target using a vaporization laser beam to produce a vaporized precursor of an appropriate or desired entrained in a pulsed, rapidly flowing, gaseous atmosphere containing at least one gas reactive with said vaporized precursor composition to form a reacted precursor of a superconducting composition. The reacted precursor composition is then formed into a substantially singular, uniform molecular beam, and deposited on a substrate in the form of a thin layer. The apparatus comprises a vaporization laser capable of producing a pulsed laser beam, a pulsed supersonic nozzle having a target chamber, a pressure chamber and a reaction tube, the reaction tube having an entry end and an exit end, the exit end having a microscopic-sized outlet. Means are provided for focusing said pulsed laser beam into the target chamber and for pulsing gases from the pressure chamber, through the target chamber and into the reaction tube. The condensed products from the gaseous reaction are, in turn, ejected through the microscopic-sized outlet in the exit end of the reaction tube.

11 Claims, 1 Drawing Sheet

METHOD FOR THE PRODUCTION OF OXIDE SUPERCONDUCTING FILMS BY LASER ASSISTED MOLECULAR BEAM EPITAXY

BACKGROUND OF THE INVENTION

The present application relates to a method and process for the production of electrically superconducting films, and more particularly to the production of thin films of superconducting oxides, for example, Perovskite type oxides commonly referred to in the art as 1-2-3 compounds.

Recently it has been found that a remarkable improvement of the critical current densities of Perovskites is obtained if epitaxial cuprate Perovskites, such as the $YBa_2Cu_3O_7$, are utilized in the form of thin, oriented films.

Typically thin films, or layers of such Perovskite-type oxide materials are produced by depositing a precursor of the superconducting material on heated substrates, usually at temperatures in the range of 400° to 800° C. The deposition process is carried out under vacuum and an initial thin amorphous film, desirably comprised of oxides containing the metallic elements present in a weight ratio of 1:2:3 based on the atomic mass of Y, Ba and Cu, is deposited on the substrate. Suitably the film may be deposited on the substrate by sputtering using a magnetron, or by evaporation using an excimer laser. The Perovskite starting materials may be supplied as separate sources, or as a single composite source. Unfortunately, precise resulting Perovskite compositions were difficult to obtain and control. In addition, the ratios within the compositions being deposited could not easily and rapidly be cultured. The structure of the precursor initially formed film, is subsequently converted into a superconducting Perovskite-like material having an orthorhombic structure, by subsequent treatment steps. For example, the film may be first heat treated, or annealed, over a period of time at temperatures ranging between about 700° and about 900° C. and subsequently the oxygen content and the desired structure the heat treated film are adjusted to the desired levels by an additional heat treatment step, usually carried out at temperatures in the range of between about 500° and to about 600° C., in an oxygen atmosphere.

Examples of the prior art relating to the use of pulsed laser beams to produce thin films of Perovskite-type superconducting oxides may be found in *Materials Research Society Proceedings,* Volume 99, 1988, pages 303-306; 327-331; 343-346; 700-702; 707-710, and 735-738; *Solid State Technology,* December, 1987, pages 39-41, and; *Applied Physics Letters,* Volume 51, No. 22, November, 1987, pages 619-621 and 1845-1847.

BRIEF DESCRIPTION OF THE INVENTION

The present invention relates to a method of directly forming a thin, oriented layer, or film, of superconducting materials, or compositions suitably mixtures of Perovskite-type superconducting oxides, on a support base, or substrate, by the use of a laser assisted molecular beam epitaxy, (LAMBE).

The invention relates to a method of depositing a thin layer of superconducting material on a substrate. The method steps generally comprise forming at least one target comprised of metallic precursors of a superconducting oxide composition and vaporizing at least a portion of the target using a vaporization laser beam to produce a vaporized precursor of an appropriate or desired superconducting composition. The vaporized composition is next entrained in a pulsed, rapidly flowing, gaseous atmosphere containing at least one gas reactive with said vaporized precursor composition to form a reacted precursor of a superconducting composition. The reacted precursor composition is then formed into a substantially singular, uniform molecular beam, and deposited on a substrate in the form of a thin layer.

The invention further comprises an improved apparatus for depositing a thin layer of superconducting material on a substrate. The apparatus comprises a vaporization laser capable of producing a pulsed laser beam, a pulsed supersonic nozzle having a target chamber, a pressure chamber and a reaction tube, the reaction tube having an entry end and an exit end, the exit end having a microscopic-sized outlet. Means are provided for focusing said pulsed laser beam into the target chamber and for pulsing gases from the pressure chamber, through the target chamber and into the reaction tube. The target chamber and the position of said tube nearest said entry end are maintained at temperature and pressure conditions to carry out gaseous reactions and the portion of the reaction tube nearest the exit end is maintained at temperature and pressure conditions to condense products from gaseous reactions. The condensed products from the gaseous reaction are, in turn, ejected through the microscopic-sized outlet in the exit end of the reaction tube.

Among other things, the invention permits simplified and better composition control and improved film characteristics than were possible in the prior art. The present invention also facilitates a high level of reproducibility of compositions, a very useful attribute for testing and commercializing superconducting films.

DETAILED DESCRIPTION OF THE INVENTION

As previously discussed, a target or starting material, comprised of metallic precursors of the final superconducting oxide material is vaporized by a pulsed laser beam. The vapor, or plasma, is condensed within a reaction tube of a pulsed supersonic nozzle in a flow of gases reactive with the metal vapor. The condensed reacted material is ejected through a small orifice in a single or substantially single, molecular beam. The beam is directed onto a substrate to form a thin layer of superconducting oxide material directly on the substrate.

Apparatus suited to carry out the present process is suitably comprised of a pulsed laser beam source and a pulsed supersonic nozzle which includes a fast flow reaction tube, or chamber. The pulses from the laser source are adjusted to coincide with the peak intensity of pulsed gas flow over the material being vaporized and reacted in gaseous form. The reacted product is then condensed and ejected from the pulsed supersonic nozzle through a microscopic-sized orifice in the form of a singular, or substantially singular, molecular beam.

Figure 1:
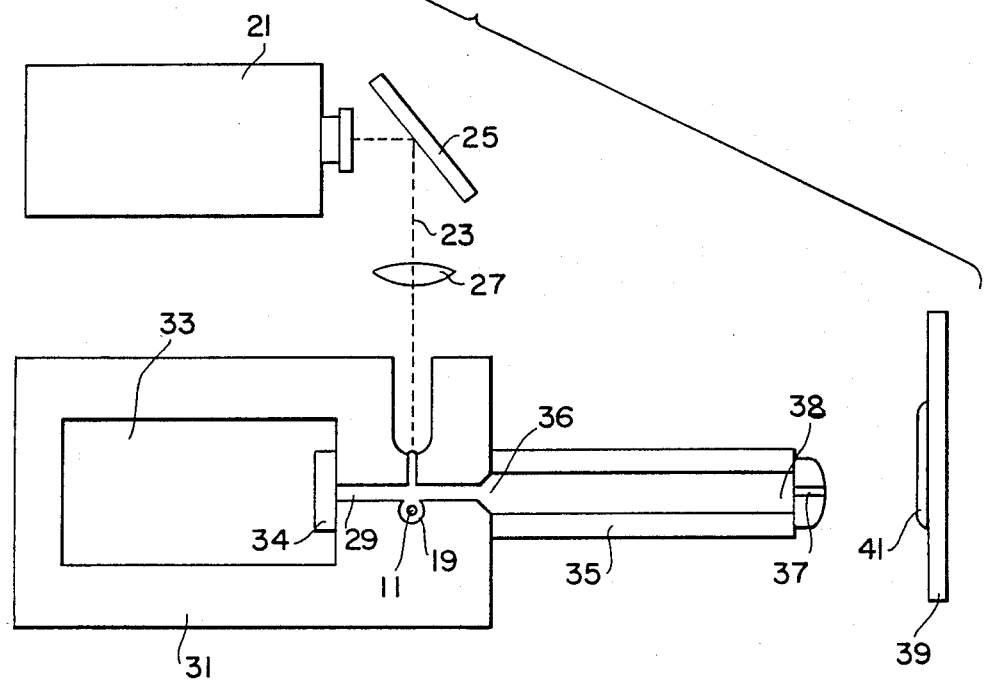
Figure 2:
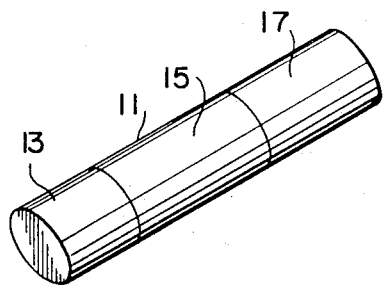

The present invention will now be described in greater detail and in terms of preferred embodiments by reference to the accompanying drawings in which, FIG. 1 is a schematic view illustrating a useful arrangement of the apparatus useful in carrying out the present invention, and FIG. 2 is a perspective view of a target in the form of a rod.

Looking now at FIG. 1, target 11, shown in greater detail in FIG. 2, or starting material, is comprised of precursors that may be reacted to form a superconducting composition. Suitable precursors are precursors of superconducting oxide materials, for example, cuprate Perovskite compositions, such as $Y_1Ba_2Cu_{O7}$ or other suitable mixtures and combinations which may, for example, include one or more of other oxide materials, such as, Bi, Ca, Sr and Cu. A preferred precursor starting material is in the form of the metallic components of such compositions, for example, yttrium, barium and copper. Preferably the metallic precursor materials are substantially pure. Generally purities in the neighborhood of 99.99%, or higher are highly desirable, however, minor amounts of impurities which do not deleteriously affect the superconducting properties of the final product may be included in the starting material.

Target 11 is suitably in the form of a rod, as best shown in FIG. 2, having segments, or bands, such as, 13, 15 and 17 of separate precursors of superconducting material, for example, separate metallic bands of yttrium, barium and copper. Segments, such as, 13, 15 and 17 may be comprised of solid portions, or may consist of layers, for example, foil layers, positioned around a core member. Although the target size suitably varies with the equipment utilized, generally rods in the neighborhood of about 3/16 to 154 inches in diameter, ranging from about 1 1/12 to 2 2/12 inches in length have been found eminently useful. Target 11 is positioned in target chamber 19 and is rotated and translated, usually in a continuous manner, suitably by a screw drive mechanism, not shown, to avoid drilling a single deep hole in the target. The translation, or reciprocation, of target 11 provides a means of vaporizing selected areas from the target which facilitates the rapid production of a variety of films varying in composition. In this manner the present invention provides a means of tuning, by movement of target 11, to control the stiocheometry of the deposited film to enable the production of a wide variety and combinations of film-forming materials.

Target 11 is selectively vaporized by means of a vaporization laser, such as 21. Laser 21 is suitably selected from those commercially available. A KrF excimer laser is aptly suited to use. Beam 23 from laser 21 may suitably be focused by a focusing means, such as mirror 25, and a focusing lens, such as, 27, and directed on target 11 in target chamber 19. In a particularly useful embodiment, the laser beam 23 may be translated, or moved, over various selected areas of target 11. Suitably, the laser beam is rectangular in cross-section. Chamber 19 is positioned within the throat 29 of a pulsed supersonic nozzle 31 Pulsed supersonic nozzle 31 has a pressure chamber 33, a pulsing means, 34, suitably a solenoid controlled o ring seal, such as described in the prior art, and a fast flow reaction tube 35.

A supply of carrier and reactant gases, generally under static pressures of from about 5 to about 20, and more preferably from about 8 to about 12 atmospheres is directed in supersonic pulses through throat 29 to entrain the vaporized target material and carry the mixture into reaction tube 35. Reaction tube 35 has an entry end 36 and an exit end 38. Temperature and pressure conditions in target chamber 19 and in the portion of reaction tube nearest entry end 36 are maintained at levels sufficient to carry out reactions between gaseous reactants. The temperature and pressure conditions in the portion of reaction tube nearest exit end 38 are maintained at levels sufficient to condense products of gaseous reactions. At least one gas utilized in the present process is reactant with the vaporized target material, for example, oxygen or a halogen, such as, fluorine. Inert gases, such as helium, are aptly suited to use as carrier gases.

The beam from laser 21 is pulsed by known means to produce suitable pulses to vaporized the target material 11. Typically a KrF excimer laser pulse (20ns duration of FWHM at 2540 Å, using a power of 300 millijoules per pulse) is satisfactorily employed to produce a useful metal vapor plasma within the pulsed supersonic nozzle.

Target 11, suitably in the form of a rod, is preferably rotated as the vaporization process is carried out. Rotational speeds between about 0.3 and 0.70 rpm for rods ranging between 0.4 and 0.8 cm in diameter are typically used. Target 11 is also preferably translated in target chamber 13 as the vaporization process is carried out. The rotation and translation operations may be combined by mounting target 11 in a screw mechanism.

The pulsed beam 23 from laser 21 is preferably timed to coincide with the peak intensity of the supersonic gas flow over target 11 within target chamber 19. The reacted vaporized target material, entrained in pulses of gas, is condensed in reaction tube 35 and ejected through microscopic orifice, or nozzle, 37. The ejected material is preferably ejected in the form of a substantially single molecular beam, that is, the superconducting oxide materials produced in reaction tube 35 exits microscopic nozzle 37 in a substantially single line, or string, molecules. In a preferred embodiment the exiting product is in the form of a single molecular beam. The ejected material is direct on substrate 39 forming superconducting layer 41. Suitably nozzle 37 is directed over selected areas of substrate 39 to form, or paint, films or layers of a desired width or thickness. In some applications of the invention the material exiting nozzle 37 may be ejected into a vacuum.

As will be evident to those skilled in the art, modifications and substitutions may be made in the practice of the present invention without departing from the spirit and scope of the invention. Such modifications and substitutions are intended to be encompassed by the scope of the following claims.

What is claimed is:

1. A method of depositing a thin layer of superconducting material on a substrate comprising the steps of:
   (a) forming at least one target comprised of metallic precursors of a superconducting oxide composition.
   (b) moving said target to vaporize at least a portion of said target using a vaporization laser beam to produce a vaporized precursor of a superconducting composition.
   (c) entraining said vaporized composition in a pulsed, rapidly flowing gaseous atmosphere containing at least one gas reactive with said vaporized precursor composition to form a reacted precursor of a superconducting composition,
   (e) forming said reacted precursor composition into a substantially singular molecular beam, and
   (f) depositing said reacted composition from said molecular beam on a substrate in the form of a thin layer.

2. The method of claim 1 wherein at least one of said metallic precursors are selected from rare earth metals.

3. The method of claim 1 wherein the target is in the form of a rod.

4. The method of claim 1 wherein the pulsed gas flow in the entrainment step is at supersonic speeds.

5. The method of claim 1 wherein the flowing gaseous atmosphere contains oxygen.

6. The method of claim 1 wherein said substantially singular molecular beam is a pulsed beam.

7. The method of claim 1 wherein the target is rotated.

8. The method of claim 1 wherein the target is translated.

9. The method of claim 3 wherein the rod is composed of separate bands of precursor materials.

10. The method of claim 3 wherein the rod is rotated during the vaporizing step.

11. The method of claim 7 wherein the target is further translated.

* * * * *